United States Patent
Sambandan et al.

(10) Patent No.: US 8,164,122 B2
(45) Date of Patent: Apr. 24, 2012

(54) THIN FILM FIELD EFFECT TRANSISTOR WITH DUAL SEMICONDUCTOR LAYERS

(75) Inventors: Sanjiv Sambandan, Sunnyvale, CA (US); Ana Claudia Arias, Los Gatos, CA (US); Gregory Lewis Whiting, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/239,078

(22) Filed: Sep. 21, 2011

(65) Prior Publication Data
US 2012/0007079 A1  Jan. 12, 2012

Related U.S. Application Data

(62) Division of application No. 12/642,132, filed on Dec. 18, 2009, now Pat. No. 8,053,818.

(51) Int. Cl.
*H01L 27/148* (2006.01)
*H01L 21/3205* (2006.01)

(52) U.S. Cl. ........................................ 257/250; 438/588

(58) Field of Classification Search ................. 438/157, 438/588, 283; 257/250
See application file for complete search history.

(56) References Cited

U.S. PATENT DOCUMENTS 8,053,818 B2 * 11/2011 Sambandan et al. .......... 257/250

OTHER PUBLICATIONS

Sambandan, S. et al., "Markov Model for Threshold-Voltage Shift in Amorphous Silicon TFTs for Variable Gate Bias", IEEE Electron Device Let., vol. 26, No. 6, pp. 375-377 (Jun. 2005).
Tai, Ya-Hsiang, et al., "Instability Mechanisms for the Hydrogenated Amorphous Silicon Thin-Film Transistors with Negative and Positive Bias Stresses on the Gate Electrodes", Appl. Phys. Let., vol. 77, No. 1, pp. 76-78 (Jul. 3, 1995).

* cited by examiner

*Primary Examiner* — Calvin Lee
(74) *Attorney, Agent, or Firm* — Jonathan A. Small

(57) ABSTRACT

A thin film field effect transistor is disclosed which provides improved time-based channel stability. The field effect transistor includes first and second disordered semiconductor layers separated by an insulator. In an embodiment a carrier injection terminal is provided in a thin semiconductor layer closest to the gate terminal. An electric field is established in the thin semiconductor layer. At sufficient field strength, the electric field extends into the second semiconductor layer, which is in contact with the source and drain terminals. At sufficient field strength a channel is established in the second semiconductor layer, permitting current to flow between source and drain terminals. Above a certain gate voltage, there is sufficient free charge is induced in the first semiconductor layer so that the field does not extend into the second semiconductor, effectively shutting off current between source and drain. Single-device transition detection (as well as other applications) may be obtained.

2 Claims, 9 Drawing Sheets

US 8,164,122 B2

THIN FILM FIELD EFFECT TRANSISTOR WITH DUAL SEMICONDUCTOR LAYERS

CROSS-REFERENCE TO RELATED APPLICATIONS

This is a divisional application of the U.S. Application for Letters Patent titled "Thin Film Field Effect Transistor with Dual Semiconductor Layers," Ser. No. 12/642,132, filed on Dec. 18, 2009 now U.S. Pat. No. 8,053,818, and issued Nov. 8, 2011, which is incorporated herein by reference and to which priority is claimed.

STATEMENT REGARDING FEDERALLY SPONSORED RESEARCH AND DEVELOPMENT

This work disclosed herein was made with government support under contract number W81XWH-08-C-0065 (3658) awarded by the Defense Advanced Research Projects Agency (DARPA), Department of Defense. The government has certain rights in the subject matter of this disclosure.

BACKGROUND

The present disclosure is related to thin film transistors, and more specifically to a thin film field effect transistor structure with dual semiconductor and insulator layers providing improved device stability and performance.

A field effect transistor (FET) is an electronic device in which current is permitted to flow between a source and a drain terminal in a conductive region, or channel, created by a voltage bias established across a gate terminal and the source terminal. Varying the voltage at the gate varies the channel size and conductivity, allowing the gate to control the flow of current between source and drain.

A thin film transistor (TFT) is typically a FET which is formed over an insulating substrate and in which the source, drain, and gate, as well as the layer in which the channel is established are formed from thin layers of material. The substrate is often glass, ceramic, plastic, fiberglass, or similar insulating material. The source, drain, and gate terminals are often formed of a patterned metal. The channel layer is typically a semiconductor, and commonly silicon (Si). Certain characteristics of the TFT are determined by the crystalline state of the semiconductor layer, which may be single crystal Si, polycrystalline Si, or amorphous Si. As used herein, polycrystalline, re-crystallized, amorphous materials, and suspension and polymer materials are collectively referred to as disordered materials.

Thin film FET designs and characteristics are well known. Thin film FETs are generally combined with other thin film devices to form operational circuits. For example, several thin film FETs may be interconnected to form switching circuits for display or detector panels, peak detection or transition detection circuits, clock doubling circuits, etc.

In the case of amorphous, polymer, and similar disordered semiconductor applications, individual thin film FETs exhibit an undesirable instability during operation. For example, the semiconductor layer presents carrier traps which fill as a function of time and current. As the number of positively charged carriers increases at the gate terminal due to the application of a gate voltage, the number of negative carriers trapped in the channel region increases. However, as a stable, fixed voltage continues to be applied to the gate terminal, the number of negative carriers trapped in the channel increases with time. This time-based trapping means that even for a fixed gate voltage, the channel current characteristics change over a relatively short period of time. This means that in a wide variety of FET devices, such as a circuit in which a signal should issue when a fixed threshold of charge is detected or exceeded, the threshold will in fact drift over time.

Another way to view this problem is to plot the electric field strength in the semiconductor layer against gate voltage at several different times, as shown in FIG. 1. At time $t_1$, a certain gate voltage v produces a certain field strength $\epsilon_1$. However, at a later time $t_2$, that same applied gate voltage v produces a field strength $\epsilon_2$ reduced by an amount $\Delta\epsilon$ as compared to the field produced by that voltage at time $t_1$. This change is field strength over time reduces carrier mobility in the channel, and hence reduces the current sensed at the drain in response to the gate voltage.

There have been numerous efforts to address this problem of time-instability. One such effort involves developing circuits with numerous thin film FETs such that instability is effectively cancelled out among the FETs. One problem with this approach is that additional FETs increase the size and power demands of the device circuitry, contrary to the desired objective of reducing device size and power consumption. Another problem is that as the number of FETs increases, so does the likelihood that one or more of the devices will fail and render the circuit inaccurate or inoperative. Still further, each FET has its own non-linearity characteristics, meaning accurate device performance is difficult to predict. Therefore, there is a need in the art for a disordered material-based thin film FET with reduced instability, which can be manufactured without significantly changing manufacturing techniques, without requiring the use of unorthodox materials, and which can otherwise easily be adapted to form an element of a known circuit.

SUMMARY

Accordingly, the present disclosure is directed to a thin film FET having improved time-based channel stability and hence improved switching stability and performance. Devices able to take advantage of reduced threshold voltage shift are therefore enabled.

According to one aspect of the disclosure a thin film FET is formed of amorphous silicon or similar disordered semiconducting material. The thin film FET comprises a gate metal formed and patterned over an insulating substrate. A first (shielding) insulating layer substantially covers the gate metal and substrate. A metal carrier injection terminal is located over the first insulating layer. A first (shielding) semiconductor layer covers the carrier injection terminal and first insulating layer. A second insulating layer covers the first semiconductor layer. Source and drain terminals are disposed over the second insulating layer and within a second semiconductor layer formed over the second insulating layer. Optionally, doped regions can be formed under the source and drain terminals to improve contact resistance, but such features are not strictly required.

According to another aspect of the disclosure, the thin film FET may be a bottom gate or top gate device. Furthermore, a second metal carrier injection terminal may be provided over the first insulating layer and within the first semiconductor layer. In addition, the source and drain terminals may be formed over the second semiconductor region (again, with or without optional doped regions thereunder). Still further, the metal carrier injection terminal may be formed and patterned over the first semiconductor layer.

In operation, a field is created by a voltage at the gate terminal. This field extends into the first semiconductor layer, but only very weakly extends into the second semiconductor layer if at all. Oppositely charged carriers, for example negative charge carriers, are trapped at the interface between the first insulating layer and the first semiconductor layer, creating an excess of positive charge carriers in the first semiconductor layer at the interface of that layer and the first insulating layer. Carriers for this accumulation are provided by the carrier injection terminal. The net imbalance in carrier charge is seen by the second semiconductor layer at its interface with the second insulating layer. The second semiconductor essentially sees a field created in the first semiconductor layer. However, this field is stabilized in the first semiconductor layer. Thus, a much more stable channel is created in the second semiconductor layer, and a more stable detector may be provided without increasing device count of the final circuit.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well known details are merely summarized or are omitted so as not to unnecessarily obscure the details of the present disclosure. Thus, where details are otherwise well known, we leave it to the application of the present disclosure to suggest or dictate choices relating to those details.

Figure 1:
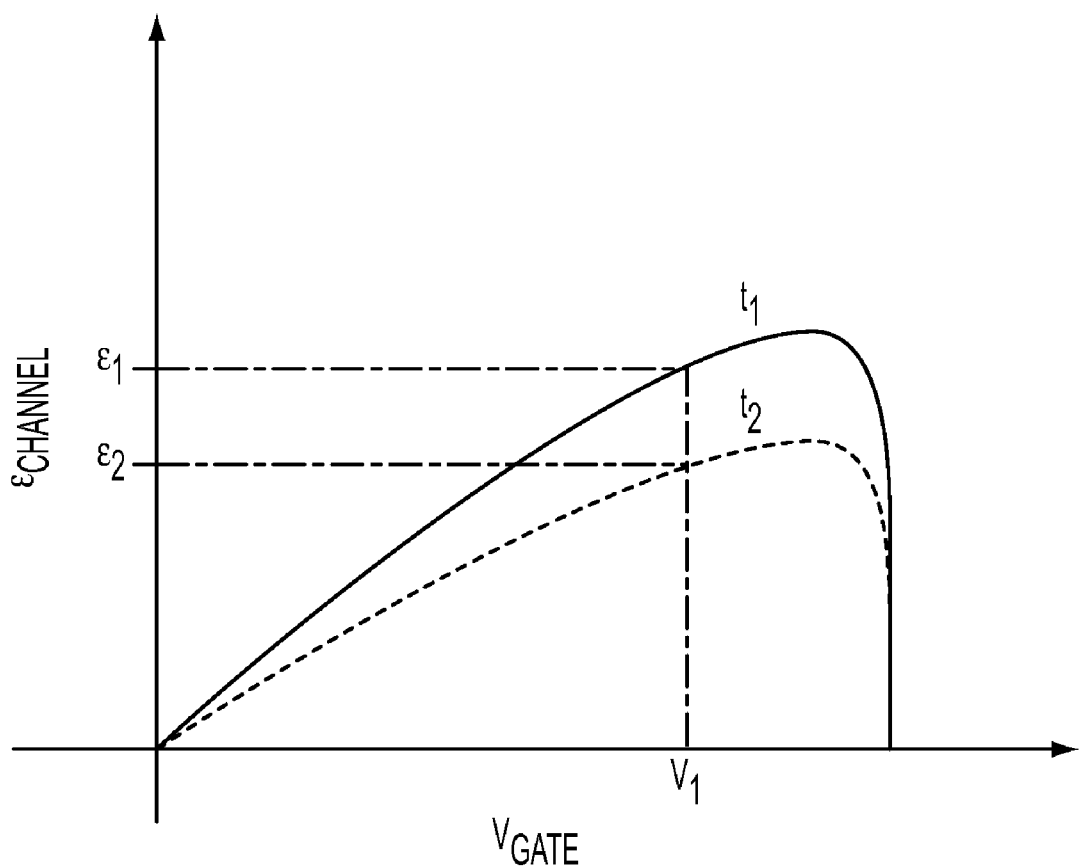
FIG. 1 is a plot of the electric field strength against gate voltage at several different times for a semiconductor layer of a prior art field effect transistor.
Figure 2:
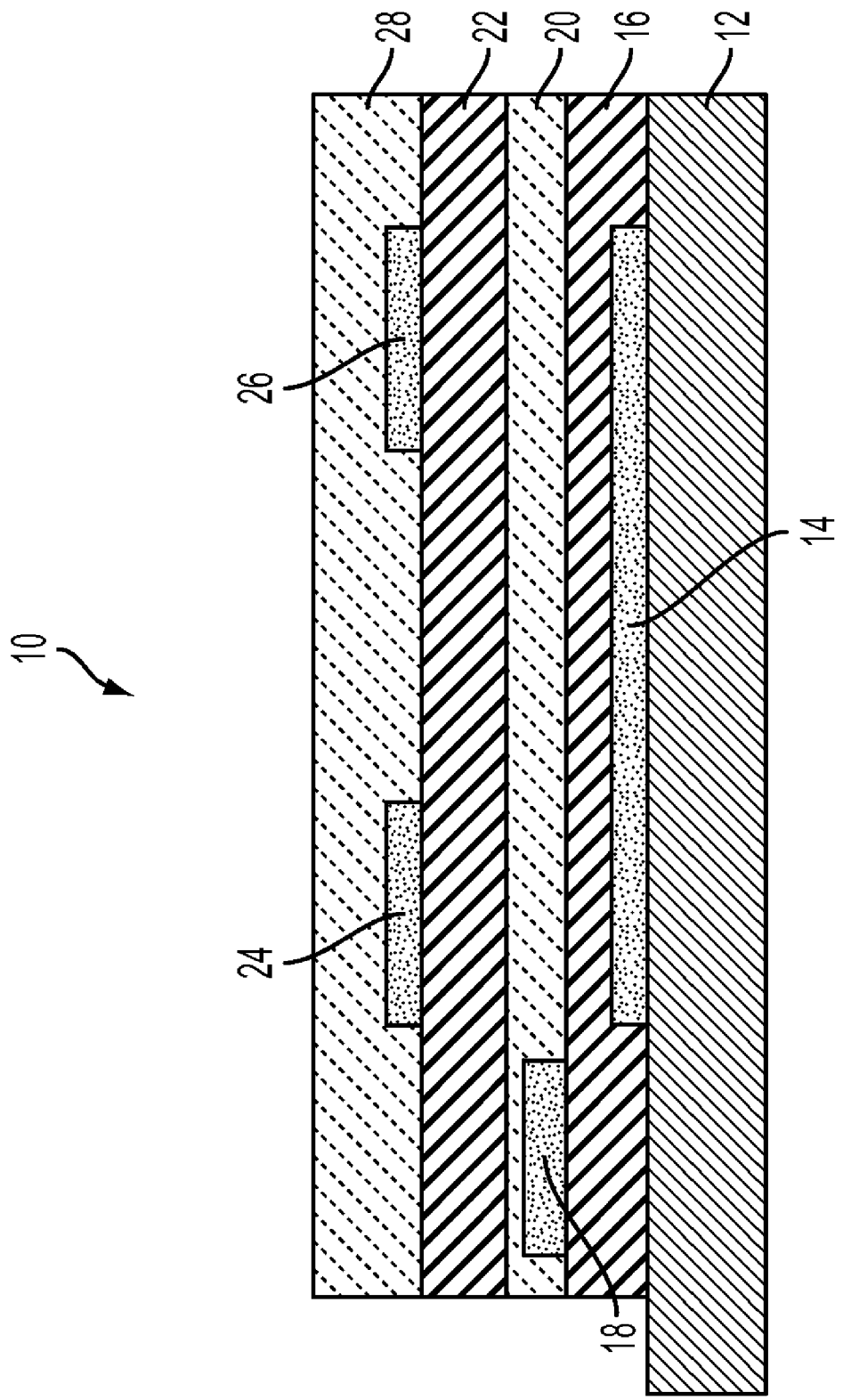
FIG. 2 is a cut-away, elevation view of a bottom gate thin film field effect transistor (TFT) with dual semiconductor layers according to one embodiment of the present disclosure.

With reference to FIG. 2, there is shown therein a thin film field effect transistor (TFT) with dual semiconductor layers 10 according to one embodiment of the present disclosure. Thin film TFT 10 comprises substrate 12, such as glass, ceramic, plastic, fiberglass, or similar insulating material. A gate terminal 14 is formed on a surface of substrate 12. In one embodiment, gate terminal is amorphous silicon deposited by plasma enhanced chemical vapor deposition (PECVD). Other materials and methods are equally useful. For example polymers can be deposited by spincoating. As an alternative, gate terminal 14 may be a doped region of substrate 12, where substrate 12 is a conductor, such as a semiconductive silicon (Si) wafer. A first (shielding) insulator layer is next formed over gate terminal 14 and any exposed portions of the surface of substrate 12. First insulator layer 16 may be any insulating material compatible with the semiconductor, for example silicon nitride with amorphous silicon, deposited by a known method, such as evaporation, printing, etc., to a thickness of roughly 1000 Å. Carrier injection terminal 18 is then formed over the surface of first insulator layer 16. Terminal 18 is a high work function conductive material capable of providing ohmic contact to a subsequently deposited semiconductor layer, sized such that terminal 18 does not overlap the channel region formed by source and drain metal. A first (shielding) semiconductor layer 20 is then formed over carrier injection terminal 18 and the exposed portion of first insulator layer 16. First semiconductor layer 20 is, in one embodiment, amorphous silicon, deposited to a thickness of between 300 Å and 500 Å by CVD or any other technique.

Next, second insulator layer 22 is formed over first semiconductor layer 20. Second insulator layer 22 may be the same material as, or different from, the first insulator layer to a thickness of roughly 1000 Å. Source terminal 24 and drain terminal 26 are formed of a highly conductive material over a surface of second insulator layer 22. Finally, second semiconductor layer 28 is formed over source and drain terminals 24, 26 and the exposed portion of second insulator layer 22. Second semiconductor layer 28 is, in one embodiment, amorphous silicon, deposited to a thickness of roughly 500 Å. An encapsulation layer (not shown) may optionally be formed over gate terminal second semiconductor layer 28.

In one mode of operation both first and second semiconductor layers 20, 28 are comprised of the same material. Carrier injection terminal 18, which serves in all embodiments to provide a source of carriers in first semiconductor layer 20, is tied to reference voltage $V_{ref}$, such as system ground. Source terminal 24 is tied to source voltage $V_s$, which in this case is also system ground. Gate terminal 14 and drain terminal 26 are tied to gate voltage $V_g$ and drain voltage $V_d$, respectively. In this mode, the device disclosed above operates in several regimes.

Case 1: $V_{gs}-V_{fb}=0$: When the gate-source bias $v_{gs}$ is zero, no electric field is present in either first or second semiconductor layers 20, 28. With regard to current between the source and drain, since there are no mobile carriers in the second semiconductor layer 28 (no channel is established), the application of a non-zero bias between source and drain, $V_{ds}$, results only in leakage current.

Case 2: $0<V_{gs}-V_{fb}<V_T$: When a gate-source bias is applied such that the gate bias is less than the threshold voltage $V_T$ of first semiconductor layer 20, there is a small amount of band bending in first semiconductor 20. We refer to this case as below threshold operation.

Disordered semiconductors have a large number of states in the band gap. In below threshold operation, the Fermi level lies in the deep states, the number of induced free carriers is low and the electrostatics is defined by the localized deep state charge. The Debye length (the distance over which effective charge separation occurs) related to the deep states can be large. For example, in amorphous silicon (a-Si:H) it is about 540 nm. This length is not bias dependent. It is a function of the material and particularly the temperature at which the material was deposited. In general, the more disordered the material, the thicker the material layer may be. If first semiconductor layer 20 is made thinner than this, non-zero band bending is induced (i.e., an electric filed is established) in second semiconductor layer 28. In such a case, a conductive channel may be established in second semiconductor layer 28, and the application of a non-zero $V_{ds}$ results in a source-drain current in second semiconductor layer 28.

The fact that first semiconductor layer 20 is formed of a disordered material is important. It is noted that the source-drain current peaks when the gate voltage is between the off voltage and the channel creation (or threshold) voltage of first semiconductor layer 20. Therefore, the device effectively works in a sub-threshold region. In the sub-threshold region, the Fermi level of the bottom semiconductor is deep in the gap where the gap state density is large. For as long as the Fermi level stays in this region of the band gap, there will be a significant electric field seen by the second semiconductor layer 28. If first semiconductor layer 20 was not disordered, the Fermi level would not be pinned in the band gap for the relatively wide range of input voltages. Therefore, we have taken advantage of the disordered nature of the semiconductor and more particularly its structural consequence.

Note that the threshold voltage $V_T$ is dependent on the thickness of the semiconductor for disordered semiconductors.

Case 3: $V_{gs}-V_{fb}\gg V_T$: When the gate bias is increased beyond $V_T$, the band-bending in first semiconductor layer 20 is very sharp and most of the carriers are present at the interface between first semiconductor layer 20 and first insulator layer 16. The bands flatten out towards second semiconductor layer 28 and the electric field does not significantly permeate into second semiconductor layer 28. Therefore, since the second semiconductor layer 28 is in flat band (i.e., no field is present to induce a channel), the application of a non-zero $V_{ds}$ results in no current flow between source and drain.

Figure 3A:
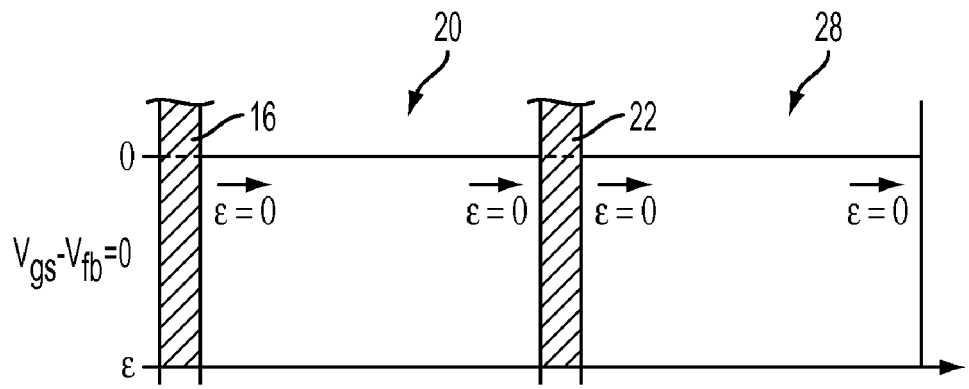
FIGS. 3A through 3C are plots of the electric field within a first and second semiconductor layers against vertical position for the cases of $V_{gs}-V_{fb}=0$, $0<V_{gs}-V_{fb}<V_T$, and $V_{gs}-V_{fb}>>V_T$, for a thin film FET according to an embodiment of the present disclosure.
Figure 3B:
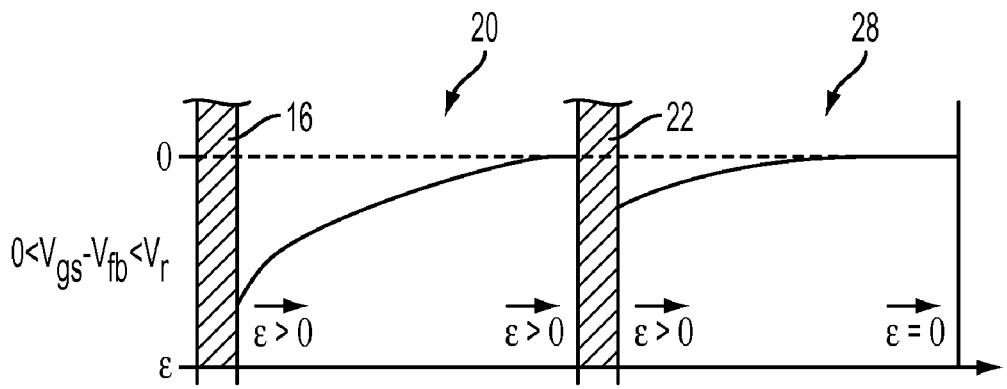
Figure 3C:
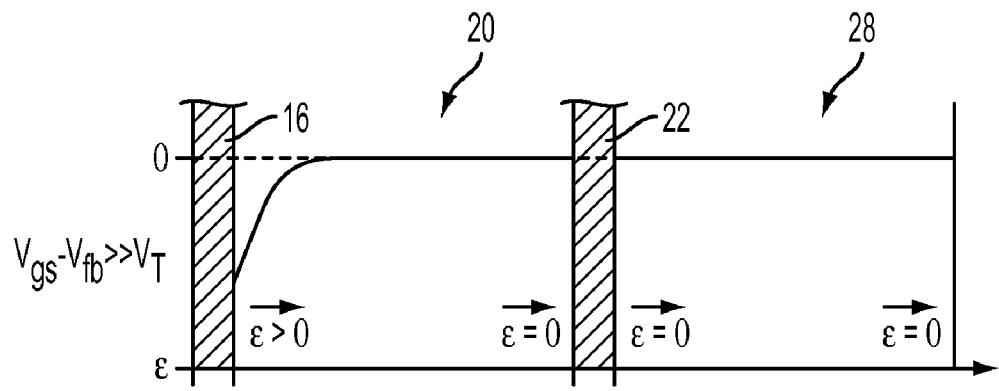

With reference to FIGS. 3A through 3O, there is shown therein plots of the electric field within the first and second semiconductor layers 20, 28 against vertical position of the aforementioned device in each of the three cases discussed above. In FIG. 3A corresponding to case 1 it can be seen that there is no field established in either first or second semiconductor layers 20, 28. This case is below threshold voltage, so this response is expected. In FIG. 3B corresponding to case 2 it can be seen that even though the bias is below the threshold voltage for second semiconductor layer 28 a field is established and current flows therein nonetheless. This is explained by the fact that the field induced in first semiconductor layer 20 induces a field in second semiconductor layer 28. This field is sufficient to establish a channel and permit carriers to flow. However, first semiconductor layer 20 effectively shields second semiconductor layer 28 from the interface effects which result in carrier trapping. Thus, first semiconductor layer 20 is also referred to herein as a shielding semiconductor layer (and likewise, first insulator layer 16 is also referred to as a shielding insulator layer). In FIG. 3C corresponding to case 3 it can be seen that the increase in $V_{gs}$ results in a shallow field in first semiconductor layer 20, due at least in part to carrier trapping. This field does not extend into or influence second semiconductor layer 28. Thus, no channel is established in second semiconductor layer 28, and the current therethrough is zero.

Figure 4:
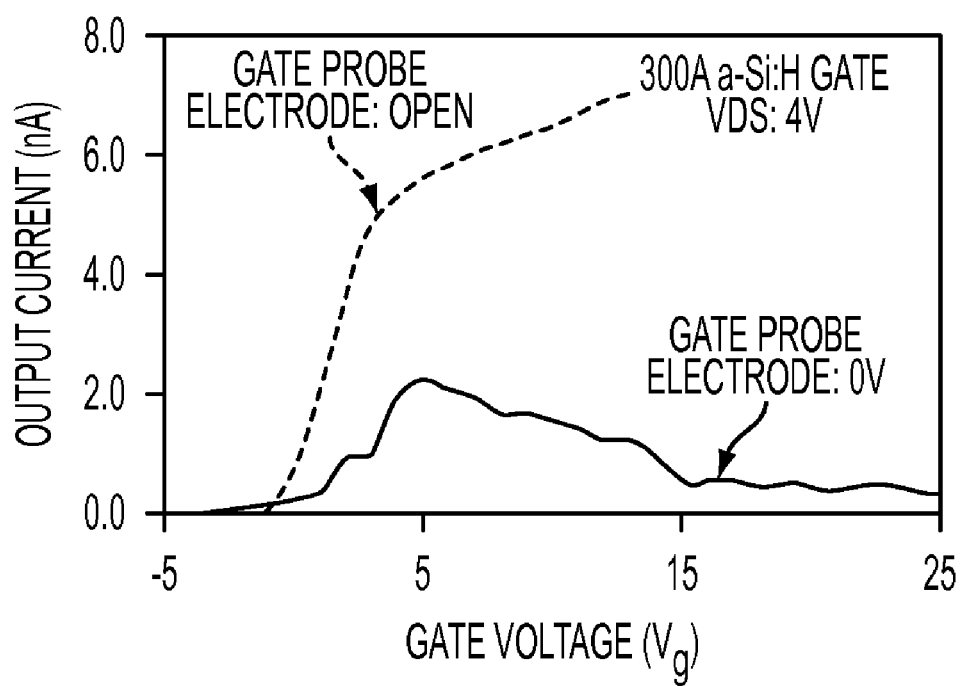
FIG. 4 is a plot of output current (between source and drain) of a second semiconductor layer as a function of the gate voltage for a thin film FET according to an embodiment of the present disclosure.

With reference to FIG. 4, there is shown therein a plot of output current (between source and drain) $i_{out}$ of the second semiconductor layer 28 as a function of the gate-source voltage $V_{gs}$. For the device illustrated in FIG. 4, first and second insulator layers 16, 22 are each 1000 Å thick, first semiconductor layer 20 is 500 Å thick, and second semiconductor layer 22 is 1000 Å thick. The source-drain bias was set at 5V. When carrier injection terminal 18 is open, the device behaves like a poor transistor due to the effectively very thick insulating layer between second semiconductor layer 28 and gate terminal 14. Moreover, the current is limited by contact resistance.

Next we consider the case of carrier injection terminal 18 being connected to ground. When the gate (input) voltage is zero, there is no vertical electric field in the device (assuming zero flatband). There is no current through second semiconductor layer 28 between source and drain terminals 24, 26. As the input voltage is increased, the band bending in first semiconductor layer 20 extends into second semiconductor layer 28. This electric field seen at second semiconductor layer 28 results in a small induced charge, and there is an increase in current between source and drain terminals 24, 26. As the input voltage is increased further, there is sufficient induced free charge in first semiconductor layer 20 so as to completely shield second semiconductor layer 28. Therefore, the current through second semiconductor layer 28 is again small. Thus, the device effectively converts a transition in input voltage, to a current pulse.

With reference to FIG. 4, it can be seen that unlike capacitive coupling the direction of the current is the same for both increasing $V_{gs}$ and decreasing $V_{gs}$. (The current is positive for both increasing and decreasing $V_{gs}$.) If the gate voltage is reduced below −1 in FIG. 4, the current will turn off until a point when the voltage is so low that p-type conduction begins to occur. This will cause a tiny increase in current.

Figure 5A:
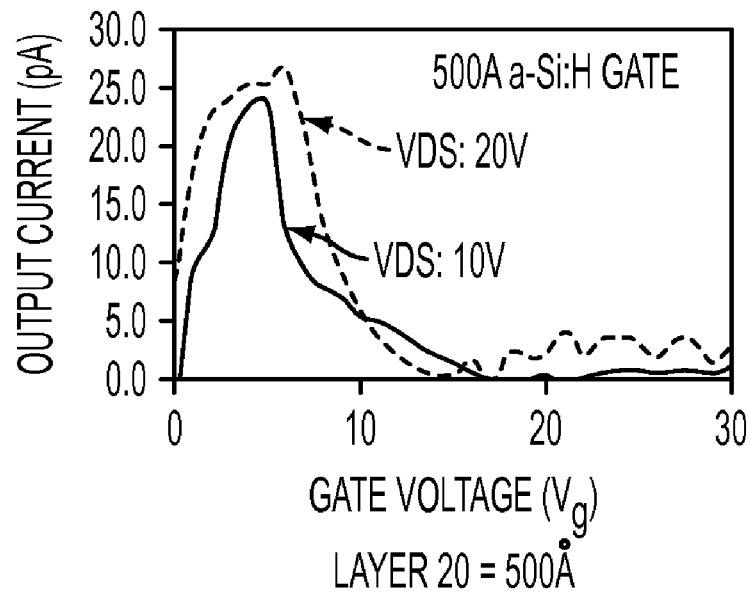
FIGS. 5A and 5B are graphs of source-drain current against gate voltage for first semiconductor thicknesses of 500 Å and 300 Å, respectively, for a thin film FET according to an embodiment of the present disclosure.
Figure 5B:
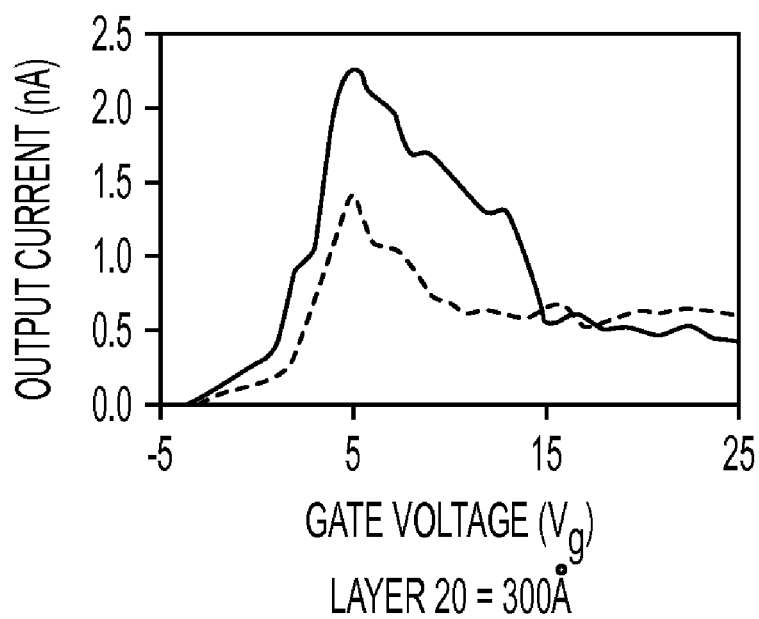

As the thickness of first semiconductor layer 20 increases the electric field permeating into second semiconductor layer 28 weakens, ultimately to the point that no field enters second semiconductor layer 28. Accordingly, as the first semiconductor layer thickness increases, the source-drain current decreases up to the point at which no current flows at all. Conversely, as first semiconductor layer 20 decreases in thickness more of the electric field formed in first semiconductor layer 20 permeates second semiconductor layer 28. The second semiconductor layer 28 then becomes conductive at a lower $V_{gs}$, and non-conductive at a high $V_{gs}$. A larger current can be supported in the channel induced into second semiconductor layer 28. This is illustrated in FIGS. 5A and 5B, which are graphs of source-drain current against gate voltage for first semiconductor thicknesses of 500 Å and 300 Å, respectively. However, if first semiconductor layer 20 is made too thin, device operation reverts to the case of a single semiconductor layer, and the issues of trapping and threshold drift reappear, and at a lower limit below roughly 100 Å, first semiconductor layer 20 looses uniformity and ceases to be able to support an electric field. A range of thickness for first semiconductor layer 20 providing desirable device performance is between 200 Å and 1,000 Å, but thicknesses outside this range may be desirable depending on the material system, operating conditions, etc. Thus, the lower semiconductor must be thinner than the effective Debye length of the deep states of the material used (for a-Si, about 500 nm), yet thick enough to have a continuous film deposit without pin holes.

There is also a generally desirable ratio of the thickness of the second semiconductor layer 28 to first semiconductor layer 20. In one embodiment, second semiconductor layer 28 is generally between 1.5 and 2.5 times the thickness of first semiconductor layer 20. However, in certain material systems, thickness ratios outside of this range may be desirable.

While the thickness of first semiconductor layer 20 is important to the overall device performance, the thickness of second semiconductor layer 28 is much less critical. Below a certain thickness the layer may not be able to support a carrier channel and may become highly resistive, and above a certain thickness bulk leakage current in the semiconductor can swamp the signal current and degrade the signal to noise performance.

The behavior of device 10, as illustrated in FIGS. 3A through 3C and FIG. 4 suggest that it is well suited to a number of applications. For example, since $i_{out}$ reaches a relative peak only at a point of transition of the gate bias, the device is well suited to perform as a single transistor threshold detection circuit. In such an application, the device is free of the problem of carrier trapping and threshold drift observed in presently known devices. The threshold voltage shift is proportional to $V_{gs}-V_t$, where $V_t$ is the threshold voltage. For $0<V_{gs}<V_t$, the threshold voltage shift is negligible.

Importantly, we have discovered that the device design disclosed herein, and variations thereon, mean that second semiconductor layer 28 is free of excessive charge trapping due to applied bias. Thus, the device demonstrates a relatively much more constant threshold voltage over time as compared with prior devices. Furthermore, while first semiconductor layer 20 may experience a time-dependent threshold voltage shift, the increase in threshold voltage actually increases the stability of second semiconductor layer 28 as its operation is effectively over a larger gate voltage range.

Furthermore, while preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, while the previous descriptions have focused on amorphous silicon, many other disordered inorganic semiconductor materials as well as organic semiconductors may form the active layers of a device of the type described herein. Many different fabrication techniques may be employed, from those described above to solution processing such as ink-jet printing, spin coating, etc.

Figure 6:
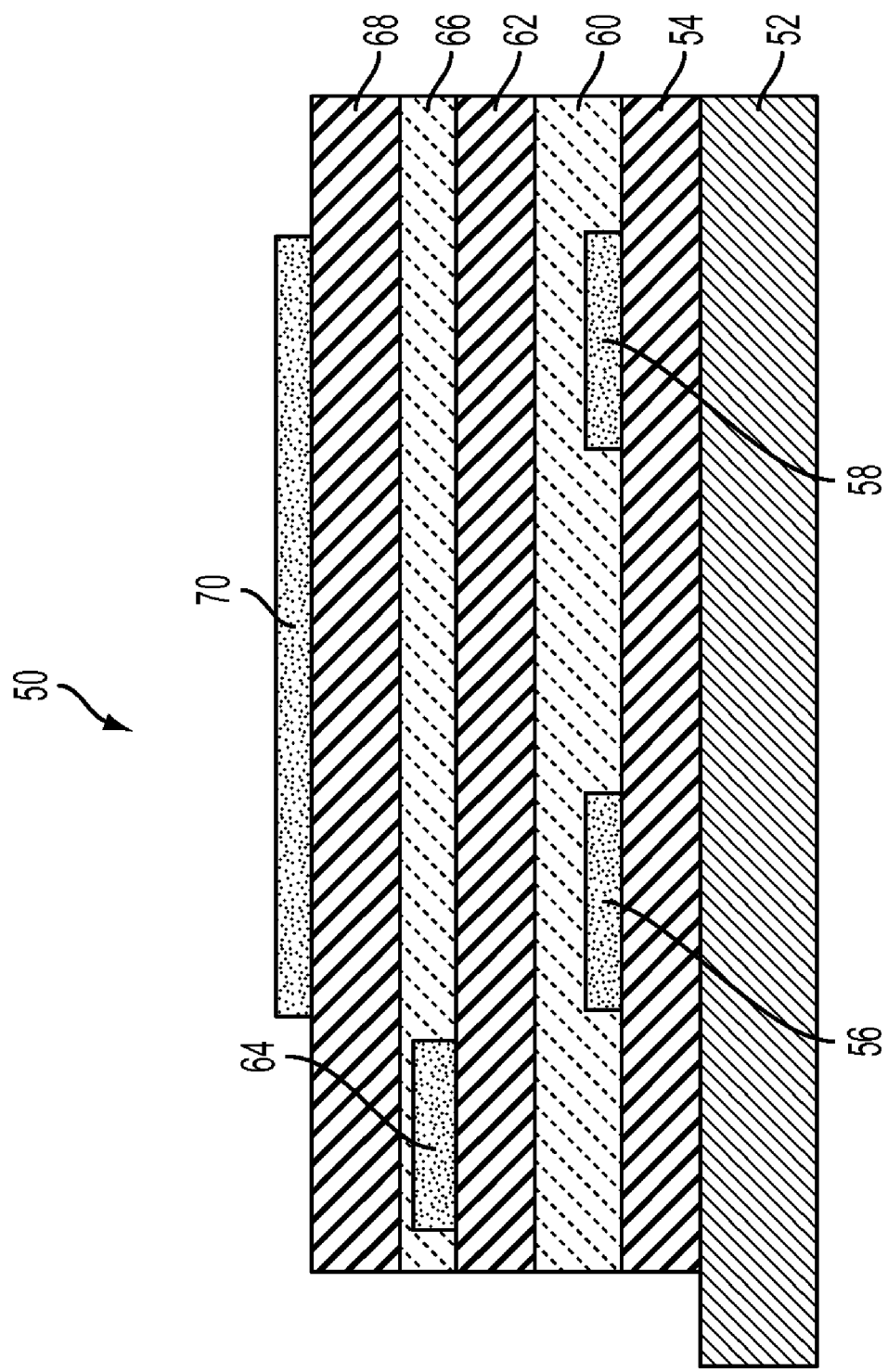
FIG. 6 is a is a cut-away, elevation view of a top-gate thin film field effect transistor (TFT) with dual semiconductor layers according to one embodiment of the present disclosure.

While the device described above is a bottom-gate FET, this disclosure is equally applicable to top-gate devices. Such a top-gate device 50 is shown in FIG. 6. Device 50 comprises a substrate 52 on which may be formed an optional adhesion/insulator layer 54. Formed over layer 54 are source and drain terminals 56, 58. First semiconductor layer 60 is formed over source and drain contacts 56, 58 and any exposed portions of the layer or substrate formed thereunder. First insulator layer 62 is formed over first semiconductor layer 60. Carrier injection terminal 64 is formed over a portion of the surface of first insulator layer 62. Second semiconductor layer 66 is formed over carrier injection terminal 64 and the exposed portion of first insulator layer 62. Second insulator layer 68 is formed over second semiconductor layer 66. Finally, gate terminal 70 is formed over a portion of second insulator layer 68. An encapsulation layer (not shown) may optionally be formed over gate terminal 70 and any exposed portion of second insulator layer 68. Device fabrication steps, parameters, and device dimensions may be substantially as described above.

Figure 7:
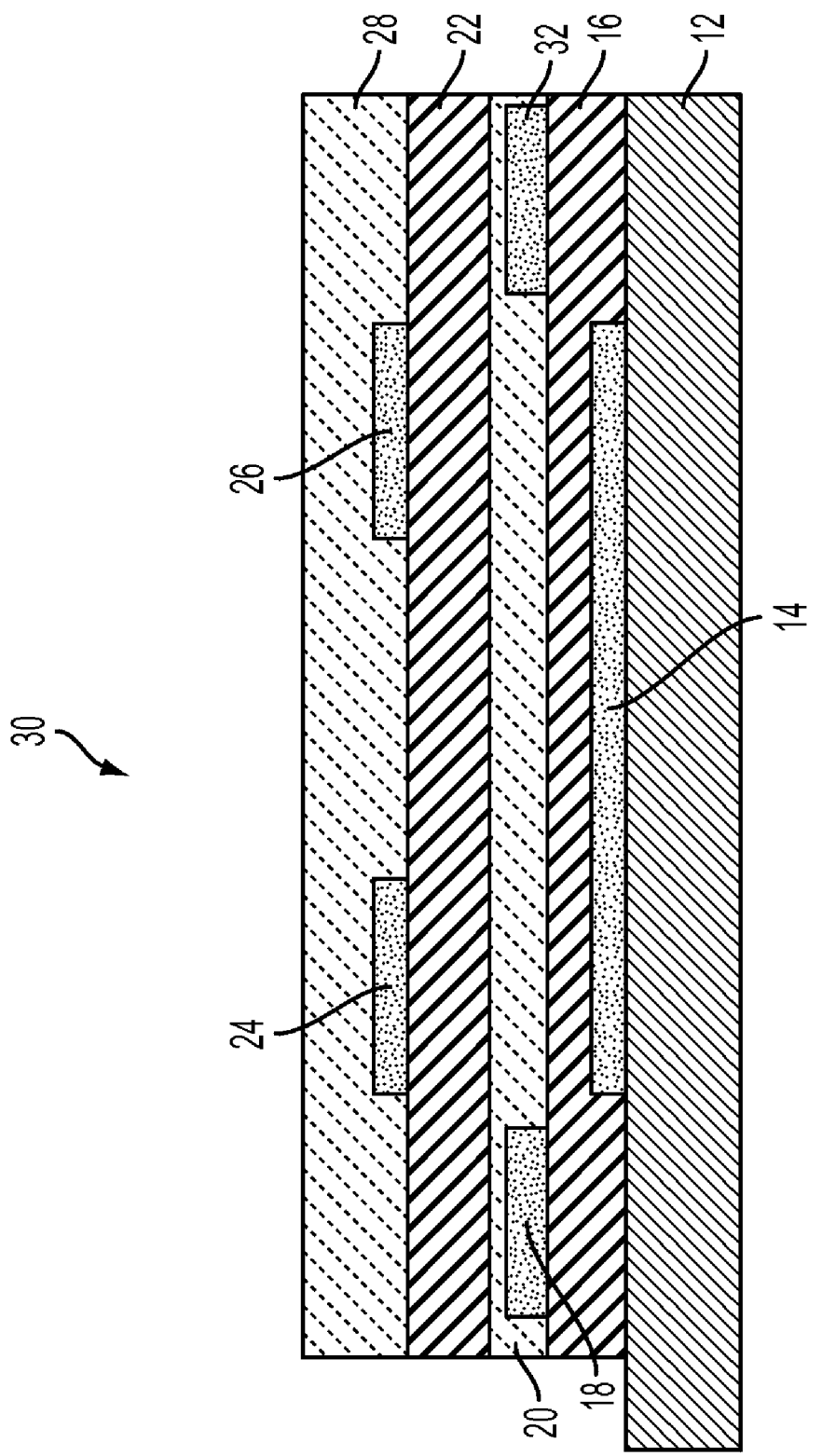
FIG. 7 is a is a cut-away, elevation view of a thin film field effect transistor (TFT) with dual semiconductor layers and dual carrier injection terminals according to one embodiment of the present disclosure.

Further still, a single carrier injection terminal 18 has been described above. However, in one variation a second carrier injection terminal 32 may be employed. An embodiment of a two-carrier injection terminal device 30 is illustrated in FIG. 7. Device 30 is substantially the same, as is its method of manufacture, as device 10 of FIG. 2, with the exception of the formation of second carrier injection terminal 32 in the same layer as and adjacent the first carrier injection terminal 18. The role of carrier injection terminal 32 is likewise the same as first carrier injection terminal 18, which is to provide carriers in response to an electric field established in first semiconductor layer 20.

Figure 8:
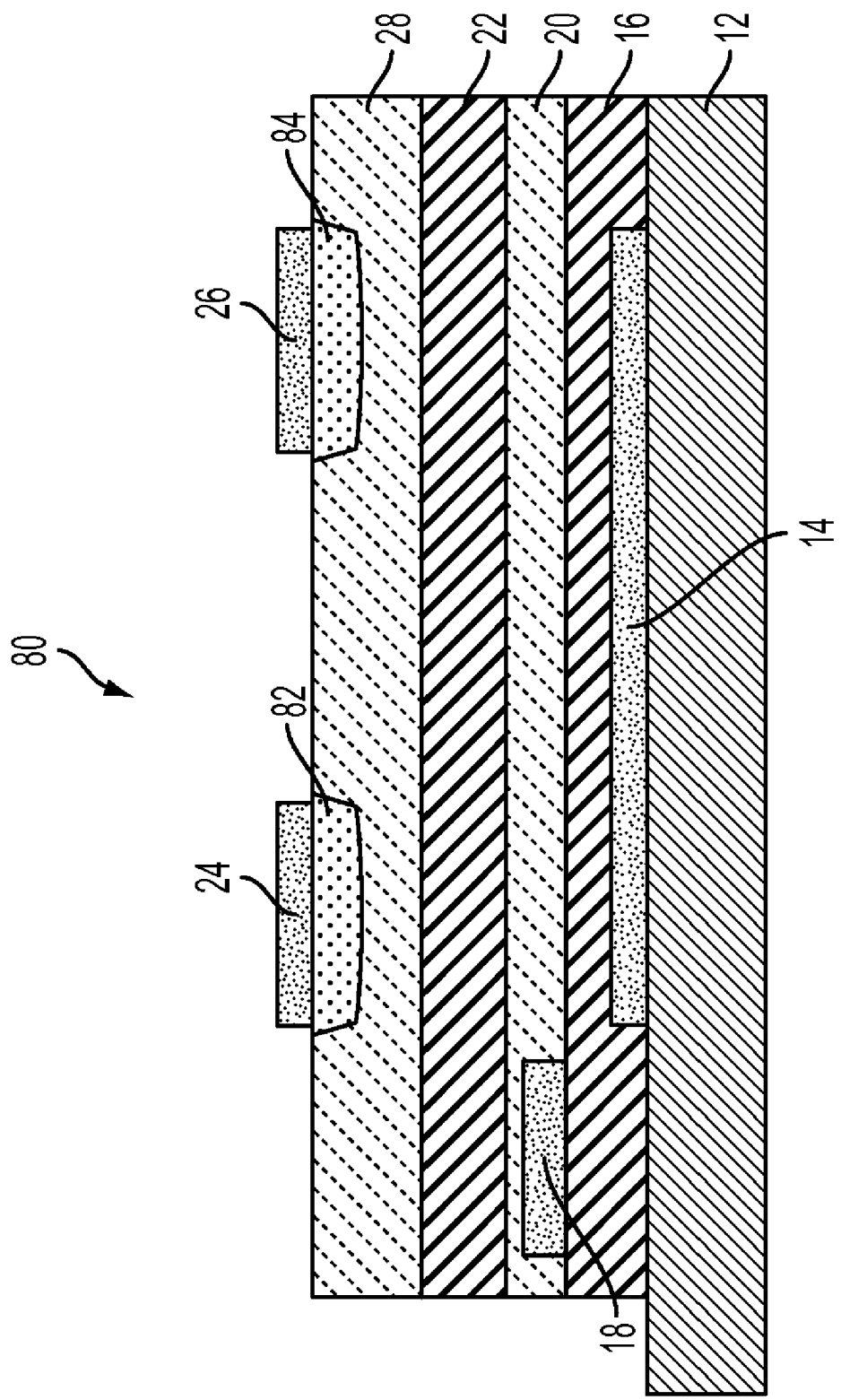
FIG. 8 is a cut-away, elevation view of a bottom gate thin film field effect transistor (TFT) with dual semiconductor layers according to another embodiment of the present disclosure.

In addition, source and drain terminals 24, 26 have been formed over second insulator layer 22 and within second semiconductor layer 28. However, these terminals may be formed over second semiconductor layer 28 as shown in embodiment 80 of FIG. 8. Optionally, implantation regions 82, 84 may be formed prior to the formation of source and drain terminals 24, 26. While not strictly required, regions 82, 84 may help reduce contact resistance.

Indeed, various presently unforeseen or unanticipated alternatives, modifications variations, or improvements therein or thereon may be subsequently made by those skilled in the art which are also intended to be encompassed by the claims, below.

Figure 9:
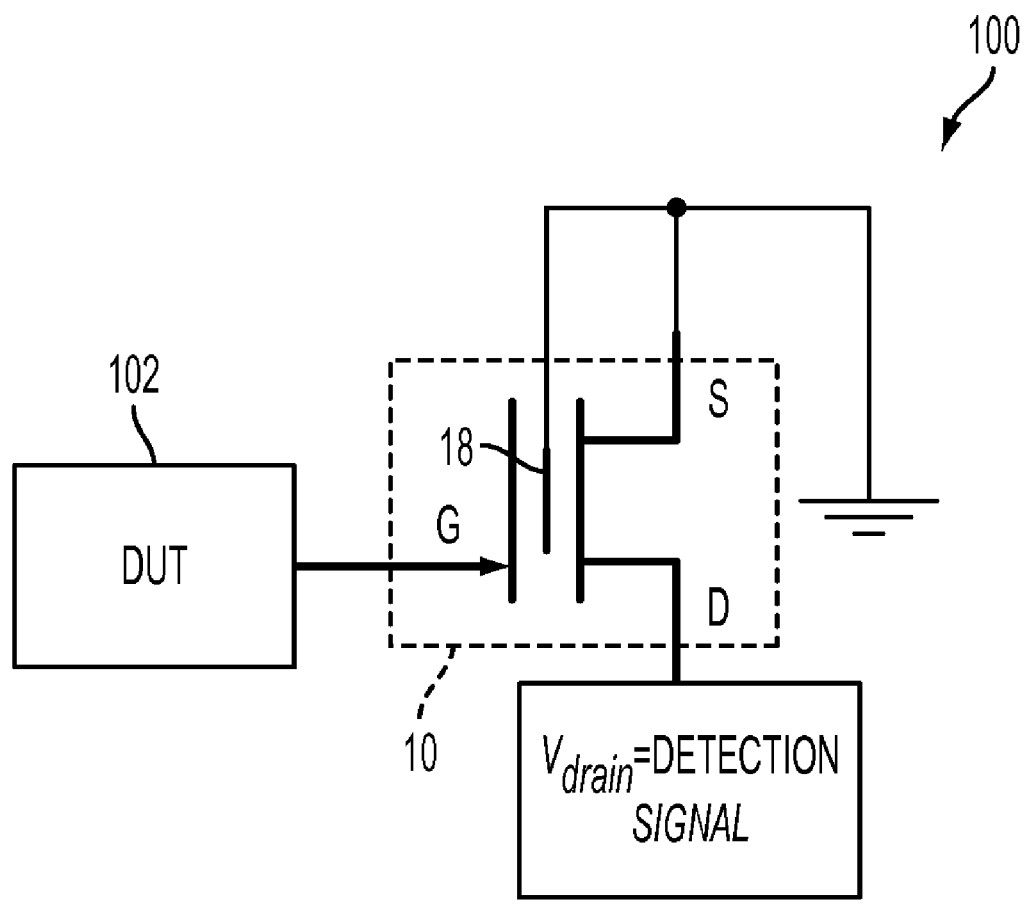
FIG. 9 is a schematic representation of a transition detection device according to an embodiment of the present disclosure.

Whit reference now to FIG. 9, there is shown therein a schematic representation of a transition detection device 100 according to an embodiment of the present disclosure. Circuit 100 comprises a thin film FET of a type previously disclosed, such as FET 10, 30, 50 or 80. For illustration purposes, we focus on the FET 10, connected as follows. Source terminal 24 is electrically interconnected to carrier injection terminal 18, which are each in turn electrically interconnected to a system ground reference potential. Gate terminal 14 is connected to a device under test 102 (DUT) such that an output signal of the DUT drives the gate potential. Drain terminal 26 is then monitored for current indicative of a threshold change in the output of the DUT. For example, circuit 100 may be used to detect when the voltage at the output of DUT 102 transitions to above or below a threshold value. As another example, the output of DUT 102 may be a square wave clock signal. Since each rise and fall of the square wave can be considered a transition, by detecting the rise and fall, the output of device 100 at the drain terminal is essentially a detection of each rise and fall or a double of the clock signal at the DUT.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Indeed, such variations may be required to accommodate for other variations in the device material, dimensions, or method of making that device. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A transition detection device comprising:
a thin film field effect transistor in which a channel may be established in a semiconductor layer by application of a bias to a gate terminal in order to control current flow between source and drain terminals, the semiconductor layer being of a disordered material type, the thin film field effect transistor further comprising:
a shielding semiconductor layer and insulator layer, each disposed between the gate and the semiconductor layer in which the channel is established; and
a first carrier injection terminal formed within said shielding semiconductor layer;
said carrier injection and said source terminals electrically interconnected to a system ground potential;
said gate terminal electrically interconnected to an output signal of a device under test; and
said drain terminal connected to provide a detection signal output for indicating a transition of the output signal of the device under test.

2. The transition detection device of claim 1, wherein said transition is a transition either from below to above or from above to below a threshold voltage of the output signal of the device under test.

* * * * *